United States Patent
Singh et al.

(10) Patent No.: US 10,615,818 B1
(45) Date of Patent: Apr. 7, 2020

(54) MIXED CHOPPING AND CORRELATED DOUBLE SAMPLING TWO-STEP ANALOG-TO-DIGITAL CONVERTER

(71) Applicant: NXP USA, INC., Austin, TX (US)

(72) Inventors: Kamlesh Singh, Noida (IN); Vikram Varma, Uttar Pradesh (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/429,053

(22) Filed: Jun. 2, 2019

(51) Int. Cl.
 *H03M 3/00* (2006.01)

(52) U.S. Cl.
 CPC ............. *H03M 3/34* (2013.01); *H03M 3/342* (2013.01); *H03M 3/46* (2013.01); *H03M 3/496* (2013.01)

(58) Field of Classification Search
 None
 See application file for complete search history.

(56) References Cited

U.S. PATENT DOCUMENTS

| | | | |
|---|---|---|---|
| 6,608,575 B2 | 8/2003 | Bazarjani | |
| 7,504,977 B2* | 3/2009 | Doorenbos | H03M 1/145 341/122 |
| 7,538,705 B2 | 5/2009 | Deval et al. | |
| 8,742,964 B2 | 6/2014 | Kleks et al. | |
| 8,797,455 B2 | 8/2014 | Gou et al. | |
| 9,077,373 B1* | 7/2015 | Nezuka | H03M 3/398 |
| 9,219,494 B2* | 12/2015 | Liu | H03M 3/398 |
| 2010/0225796 A1 | 9/2010 | Lim et al. | |
| 2011/0200070 A1* | 8/2011 | Makinwa | G01K 1/024 374/170 |

OTHER PUBLICATIONS

Chia-Hung Chen, Yi Zhang, Tao He, Patrick Y. Chiang and Gabor C. Temes, "A 11μW 250 Hz BW Two-Step Incremental ADC with 100 dB DR and 91 dB SNDR for Integrated Sensor Interfaces", IEEE 978-1-4799-3286-3/14/, 2014.

* cited by examiner

*Primary Examiner* — Howard Williams
(74) *Attorney, Agent, or Firm* — Charlene R. Jacobson (57) ABSTRACT

A two-step, hybrid analog-to-digital converter (ADC) includes a Delta-Sigma ADC that employs chopping to resolve MSBs, a Nyquist ADC that employs correlated double sampling (CDS) to resolve LSBs, and a combiner that combines the MSBs and the LSBs to generate a digital output signal. The Delta-Sigma ADC has first and second integrators where, after resolving the MSBs, the first integrator is re-configured to function as a reference buffer for the Nyquist ADC and the second integrator is re-configured to function as the Nyquist ADC.

13 Claims, 7 Drawing Sheets

MIXED CHOPPING AND CORRELATED DOUBLE SAMPLING TWO-STEP ANALOG-TO-DIGITAL CONVERTER

BACKGROUND

The present invention relates generally to electronics and, more particularly, to analog-to-digital converters (ADCs).

An ADC receives an analog input signal and generates a digital output signal that represents the magnitude of the analog input signal. Over-sampled Delta-Sigma ADCs and Nyquist (like flash, cyclic, SAR, etc.) ADCs are two known types of ADC. Also known are two-step, hybrid ADCs that use a Delta-Sigma conversion for one or more most significant bits (MSBs) in a first conversion step and then Nyquist conversion for one or more least significant bits (LSBs) in a second conversion step, where the MSBs and LSBs are then combined to generate the digital output signal. Because the Delta-Sigma conversion is typically oversampled, it takes longer (more clock cycles) to resolve each bit than with Nyquist conversion, which resolves each bit in a single cycle. Using Nyquist conversion to resolve the LSBs in a hybrid ADC speeds up the overall ADC conversion process compared to a Delta-Sigma ADC.

ADCs are known to experience offset and flicker noise that can adversely affect the accuracy of the output signal generated by the ADC. One technique for reducing the effects of offset and flicker noise in ADCs is chopping. Chopping relies on up-conversion of offset and flicker noise in the frequency domain and subsequent low-pass filtering. In a two-step, hybrid ADC, it is known to apply chopping both in the Delta-Sigma portion that generates the MSBs and in the Nyquist portion that generates LSBs.

However, in a two-step hybrid incremental Delta-Sigma ADC, it also is necessary to scale the reference for the second conversion step. Inaccuracy in this scaling can result in non-linearity, so chopping is not effective in removing the offset during the second conversion step because there is no effective filtering mechanism for offset, which has been up-converted to the chopping frequency. Accordingly, it would be advantageous to have two-step Delta-Sigma ADC that performs accurate scaling.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

As noted above, in a two-step, hybrid ADC, while chopping can be used to remove flicker noise during the Delta-Sigma coarse conversion, chopping is not suitable for reference scaling for the Nyquist fine conversion because, with chopping, low-pass filtering of the up-converted flicker noise and offset is needed. During Delta-Sigma conversion, up-converted flicker noise is rejected by the low-pass digital filter. But when chopping is used for reference scaling to generate the reference voltage for Nyquist conversion, it is difficult to low-pass filter the up-converted offset and flicker noise.

Correlated Double Sampling (CDS) may be used for reducing the effects of offset and flicker noise in an ADC. CDS relies on storing offset and correlated flicker noise on a capacitor and then subtracting the capacitor voltage when generating the reference voltage used to resolve subsequent samples. This results in cancellation of offset and slowly varying flicker noise. In a two-step, hybrid ADC, it is known to employ CDS both for the delta-sigma ADC that generates the MSBs and for the Nyquist ADC that generates the LSBs.

However, CDS has the disadvantage of doubling the uncorrelated thermal noise of the opamp used to generate the reference voltage. Thus, while CDS can be used in a hybrid ADC both to reduce flicker noise during the Delta-Sigma coarse conversion and provide accurate scaling of the reference voltage for the Nyquist fine conversion, CDS is not a power efficient solution because it doubles the thermal noise power of the opamp.

Chopping is a more power-efficient solution to remove low frequency flicker noise. Offset and flicker noise is up-converted to the chopping frequency and multiples thereof. On low pass filtering, offset and flicker noise is rejected. Unlike CDS, the uncorrelated thermal noise level remains the same.

This motivates the use of chopping during the coarse (i.e., MSB) Delta-Sigma conversion and the use of CDS during fine (i.e., LSB) Nyquist conversion.

In one embodiment, the present invention provides a two-step, hybrid ADC comprising a Delta-Sigma ADC that uses chopping to resolve one or more MSBs for the analog input signal, a Nyquist ADC that uses CDS to resolve one or more LSBs for the analog input signal, and a combiner that combines the one or more MSBs and the one or more LSBs to generate the digital output signal. In general, the Delta-Sigma ADC can be any suitable type of Delta-Sigma ADC such as a continuous-time or a discrete-time Delta-Sigma ADC of any suitable order, and the Nyquist ADC can be any suitable type of Nyquist ADC such as a cyclic Nyquist ADC or a flash Nyquist ADC.

In another embodiment, the present invention provides a method for converting an analog input signal into a digital output signal. The method includes the steps of performing Delta-Sigma ADC processing with chopping to resolve one or more MSBs for the analog input signal and then performing Nyquist ADC processing using CDS to generate a reference voltage for the Nyquist ADC processing to resolve one or more LSBs for the analog input signal. Next, the one or more MSBs are combined with the one or more LSBs to generate the digital output signal.

Figure 1:
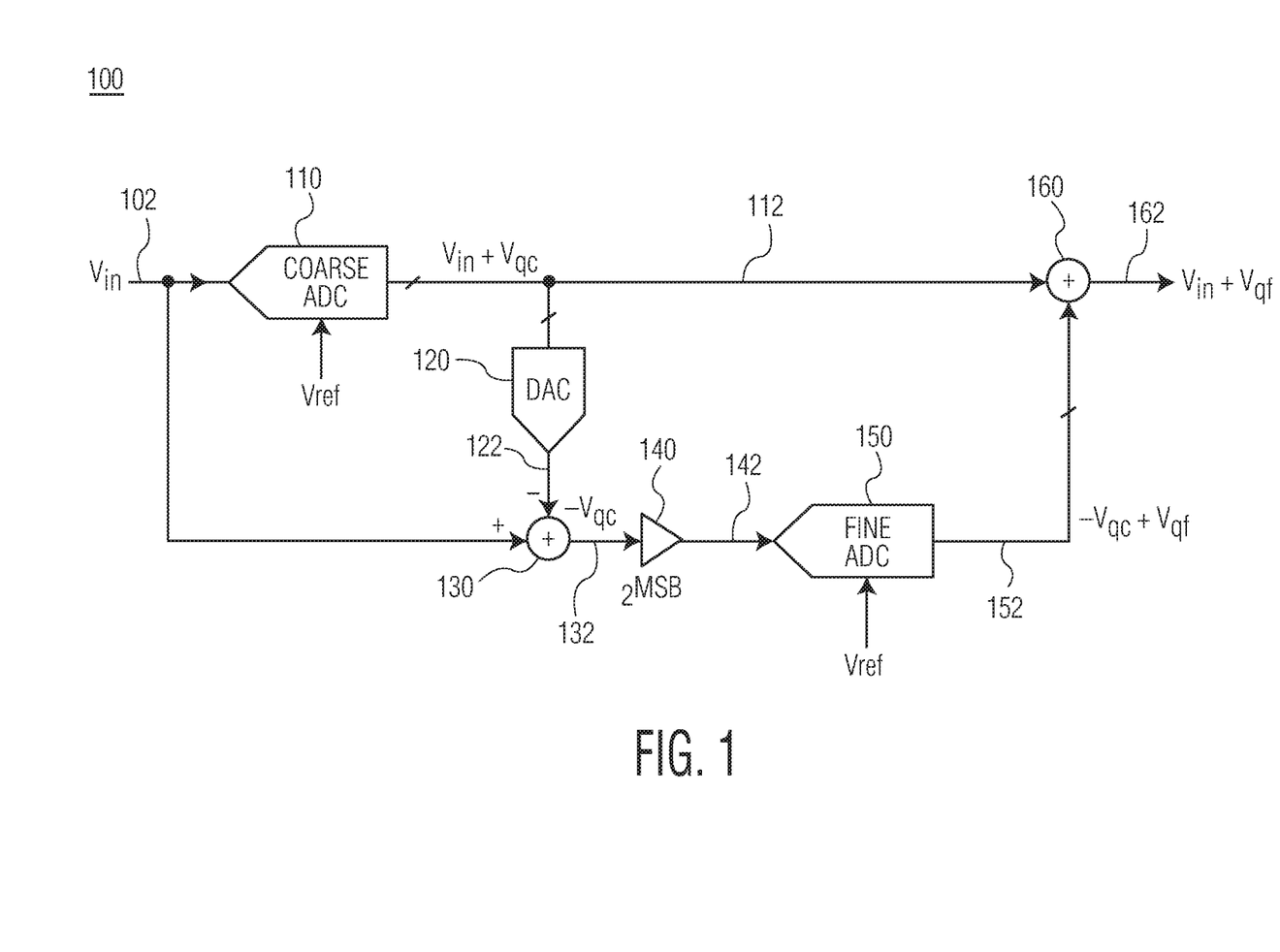
FIG. 1 is a schematic block diagram of a two-step, hybrid ADC according to one embodiment of the present invention.

Referring now to FIG. 1, a block diagram of a two-step, hybrid ADC 100 that generates a digital output signal 162 corresponding to an analog input signal 102, according to one embodiment of the invention, is shown. The hybrid ADC 100 comprises a coarse ADC 110 that resolves one or more MSBs for the analog input signal 102 to generate a digital MSB signal 112, a fine ADC 150 that resolves one or more LSBs for the analog input signal 102 to generate a digital LSB signal 152, and a digital combiner 160 that combines the digital MSB signal 112 and the digital LSB signal 152 to generate the digital output signal 162.

As known in the art, there is typically an overlap between the MSBs and the LSBs such that the digital combiner 160 takes the overlapping bits in the digital MSB and LSB signals 112 and 152 into account when generating the digital output signal 162.

As shown in FIG. 1, the digital MSB signal 112 is applied to a digital-to-analog converter (DAC) 120, which generates a corresponding analog signal 122 that is subtracted from the analog input signal 102 at analog summer 130 to generate an analog residual signal 132. The analog residual signal 132 is scaled at gain node (e.g., opamp) 140 by the factor $2^{MSB}$ to generate the scaled analog residual signal 142 that is applied to the fine ADC 150. The purpose of the gain node 140 is to enable the processing of the fine ADC 150 to be implemented using the same reference voltage Vref as is used in the processing of the coarse ADC 110. This scaling allows the fine ADC 150 to be only as accurate as the number of LSB bits being resolved by it, as opposed to being as accurate as the overall ADC (MSB+LSB bits accurate) without the scaling.

The analog input signal 102 is represented by the analog voltage level Vin. The digital MSB signal 112 is represented by (Vin+Vqc), where Vqc represents the quantization noise of the coarse ADC 110. The analog residual signal 132 is represented by (−Vqc), which represents the analog voltage level after subtracting (Vin+Vqc) from Vin. The digital LSB signal 152 is represented by (−Vqc+Vqf), where Vqf represents the quantization noise of the fine ADC 150. The digital output signal 162 is represented by (Vin+Vqf), indicating that the digital output signal 162 represents the analog input signal Vin to within the quantization noise Vqf of the fine ADC 150.

As described further below, in one implementation, the coarse ADC 110 is a second-order Delta-Sigma ADC that uses chopping to resolve the MSBs for the analog input signal 102, and the fine ADC 150 is a Nyquist ADC that uses CDS to resolve the LSBs for the analog input signal 102.

Figure 2:
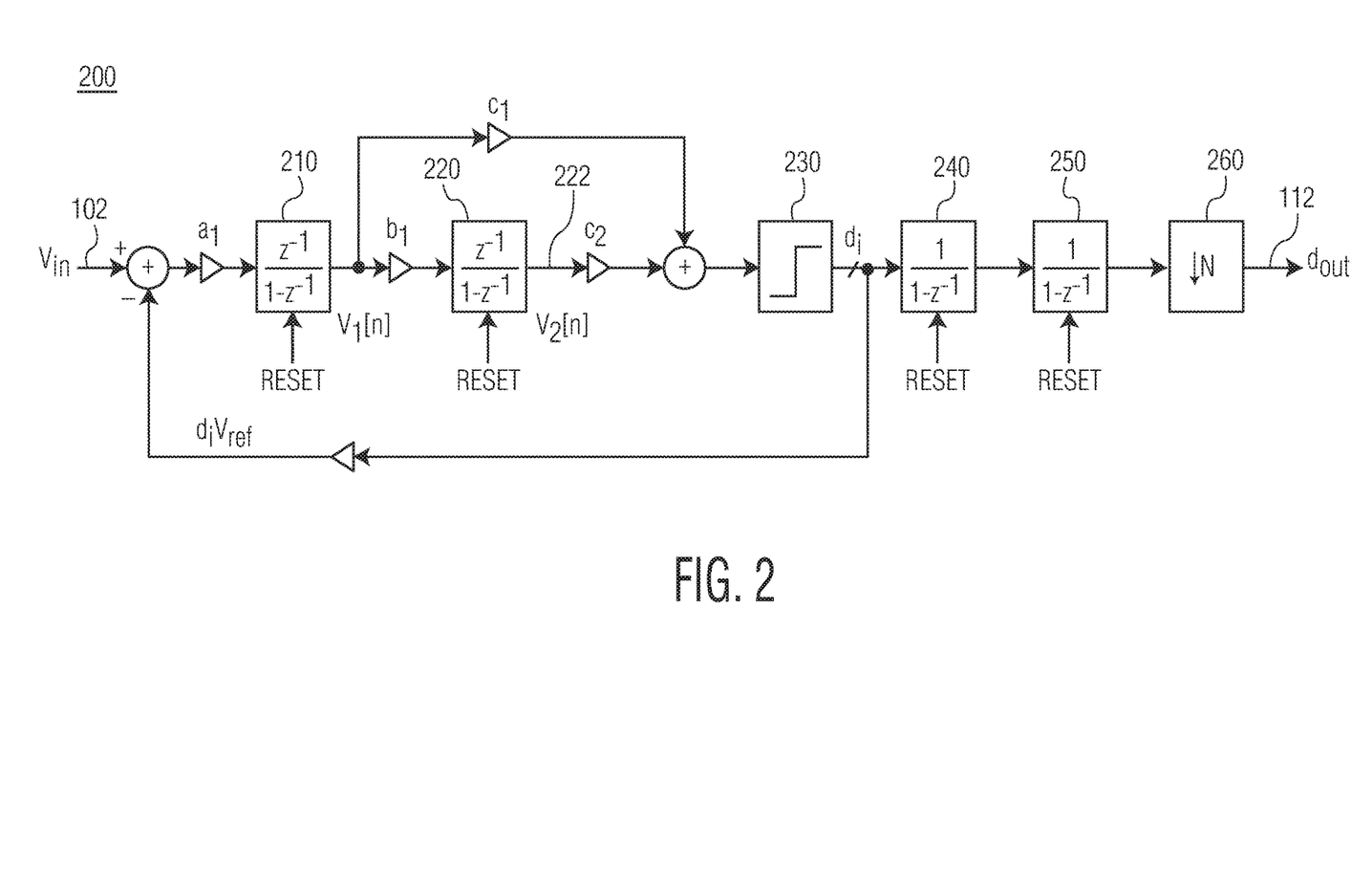
FIG. 2 is a schematic block diagram of a second-order Delta-Sigma ADC that can be used to implement the coarse ADC of FIG. 1.

FIG. 2 is a block diagram of a second-order Delta-Sigma ADC 200 that can be used to implement the coarse ADC 110 of FIG. 1. The second-order Delta-Sigma ADC 200 includes first and second integrators 210 and 220, a one-bit comparator 230, digital accumulators 240 and 250, and a down sampler 260. When used to implement the coarse ADC 110 of FIG. 1, the Delta-Sigma ADC 200 receives the analog input signal 102 and generates the digital MSB signal 112. As understood by those skilled in the art, the ADC 200 is an incremental Delta-Sigma ADC with a periodic reset that can provide sample-by-sample conversion with oversampling that avoids the need for stringent matching of analog components.

The fine ADC 150 of FIG. 1 can be implemented using a Nyquist ADC. As understood by those skilled in the art, the Nyquist ADC can have several types of implementation like successive approximation (SAR) ADC, cyclic ADC, pipeline ADC, flash ADC, etc. When used to implement the fine ADC 150 of FIG. 1, the Nyquist ADC receives the amplified analog residue signal 142 and generates the digital LSB signal 152. Additionally, a reference buffer might be needed to drive the reference of the Nyquist ADC 150.

Figure 3:
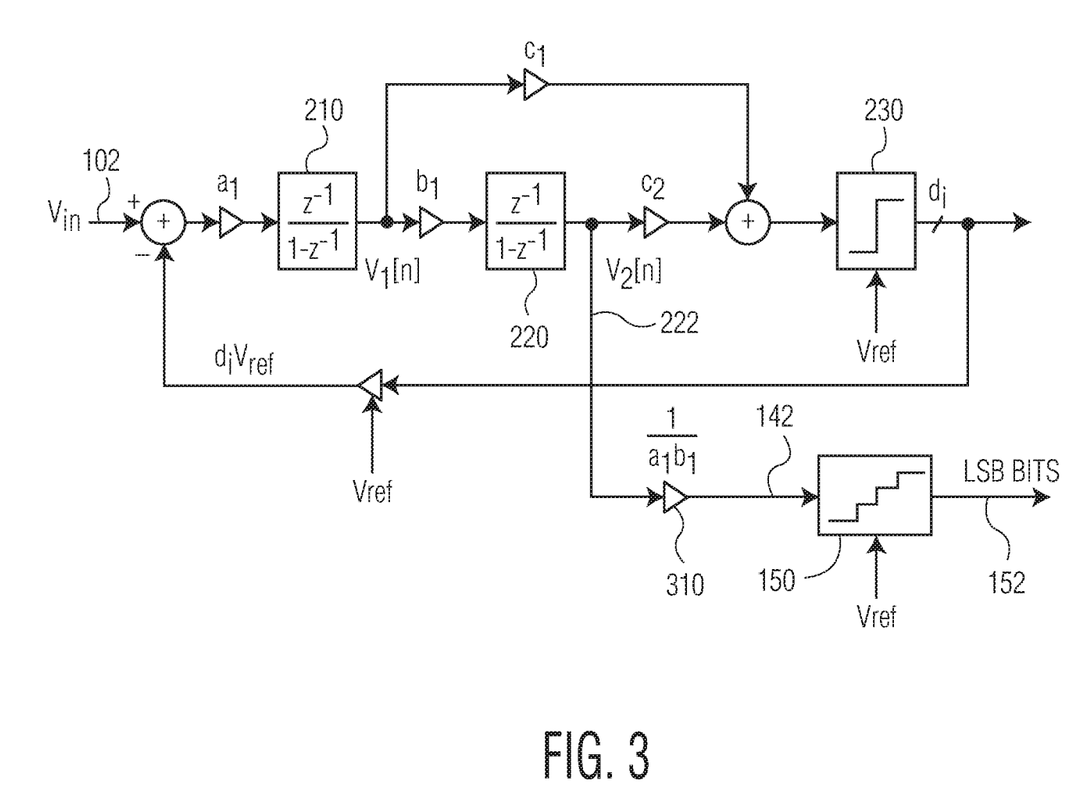
FIG. 3 is a schematic block diagram showing (i) a portion of the coarse ADC of FIG. 1 when implemented using the second-order Delta-Sigma ADC of FIG. 2 and (ii) the fine ADC of FIG. 1 when implemented using a Nyquist ADC according to one embodiment of the present invention.

FIG. 3 is a block diagram showing (i) a portion of the coarse ADC 110 of FIG. 1 when implemented using the second-order Delta-Sigma ADC 200 of FIG. 2 and (ii) the fine ADC 150 of FIG. 1 when implemented using a Nyquist ADC according to one possible embodiment. Note that FIG. 3 does not show the digital accumulators 240 and 250 and the down-sampler 260 of the second-order Delta-Sigma ADC 200 of FIG. 2.

Instead of using the DAC 120, analog summer 130, and gain node 140 of FIG. 1 to generate the analog residual signal 142 that is applied to the fine ADC 150, the implementation of FIG. 3 takes advantage of the fact that the analog signal 222 intrinsically available at the output of the second integrator 220 at the end of the coarse conversion step is a scaled version of the analog residual signal 142. As such, the implementation of FIG. 3 includes a gain node (e.g., an opamp) 310 which scales down the analog signal 222 to generate the analog residual signal 142. Such an embodiment avoids the DAC 120, the analog summer 130, and the gain node 140 of FIG. 1, which are the main sources of non-linearity in the overall ADC.

Figure 4:
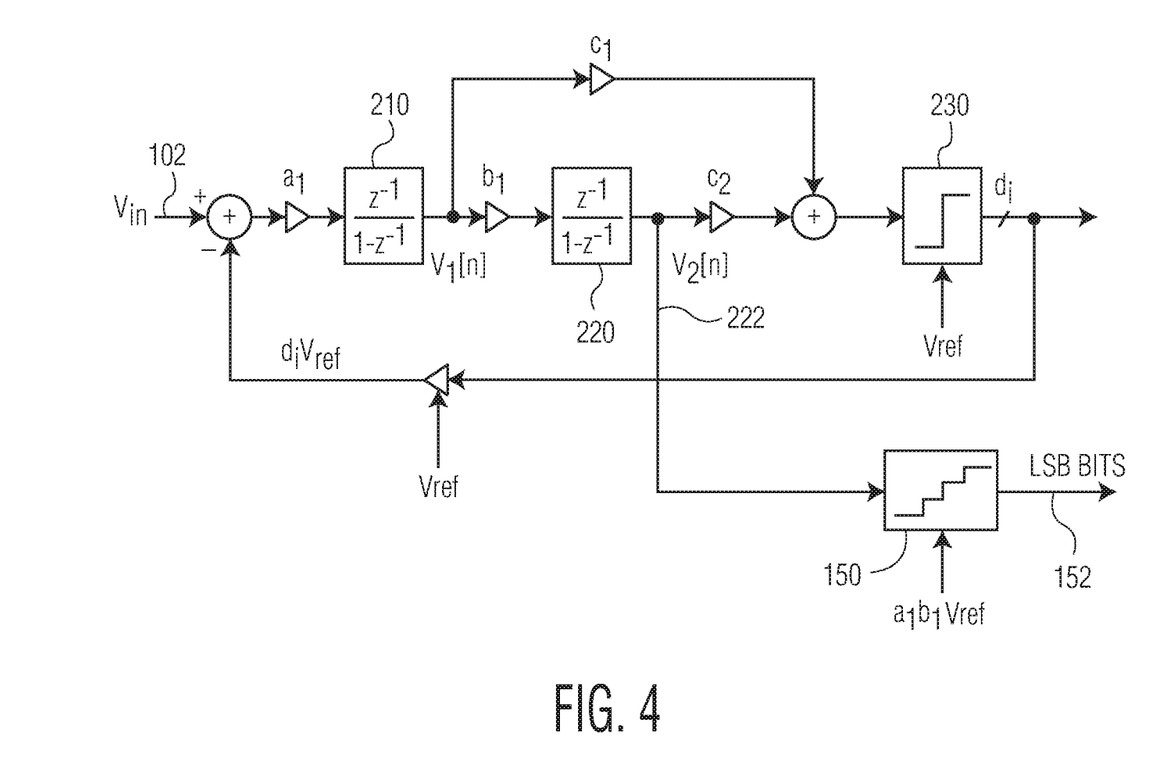
FIG. 4 is a schematic block diagram showing (i) a portion of the coarse ADC of FIG. 1 when implemented using the second-order Delta-Sigma ADC of FIG. 2 and (ii) the fine ADC of FIG. 1 when implemented using a Nyquist ADC according to another embodiment of the present invention.

FIG. 4 is a block diagram showing (i) a portion of the coarse ADC 110 of FIG. 1 when implemented using the second-order Delta-Sigma ADC 200 of FIG. 2 and (ii) the fine ADC 150 of FIG. 1 when implemented using a Nyquist ADC according to another possible embodiment. Here, too, as in the embodiment of FIG. 3, FIG. 4 does not show the digital accumulators 240 and 250 and the down-sampler 260 of the Delta-Sigma ADC 200 of FIG. 2, and the embodiment does not include the DAC 120, the summer 130, and the gain node 140 of FIG. 1.

In the embodiment of FIG. 4, instead of scaling down the analog signal 222 generated by the second integrator 220 to generate the analog residual signal 142 for application to the fine ADC 150 as in FIG. 3, here the reference signal applied to the fine ADC 150 is scaled up, and the analog signal 222 is applied directly to the fine ADC 150 in order to generate the equivalent digital LSB signal 152.

Note that the scaling of the analog signal 222 in FIG. 3 and the scaling of the reference voltage Vref in FIG. 4 could instead be performed subsequently in the digital domain when combining the digital MSB and LSB signals 112 and 152. Such implementations would require the use of larger-sized analog components in the fine (Nyquist) ADC 150 due to matching requirements of analog and digital scaling coefficients, which implies an area penalty that might be unacceptable.

Although not represented in FIGS. 1-4, in certain embodiments of the invention, the coarse ADC 110 of FIG. 1 is implemented with a second-order Delta-Sigma ADC that uses chopping to generate the digital MSB signal 112, and the fine ADC 150 of FIG. 1 is implemented with a Nyquist ADC that uses CDS to generate the digital LSB signal 152.

Figure 5:
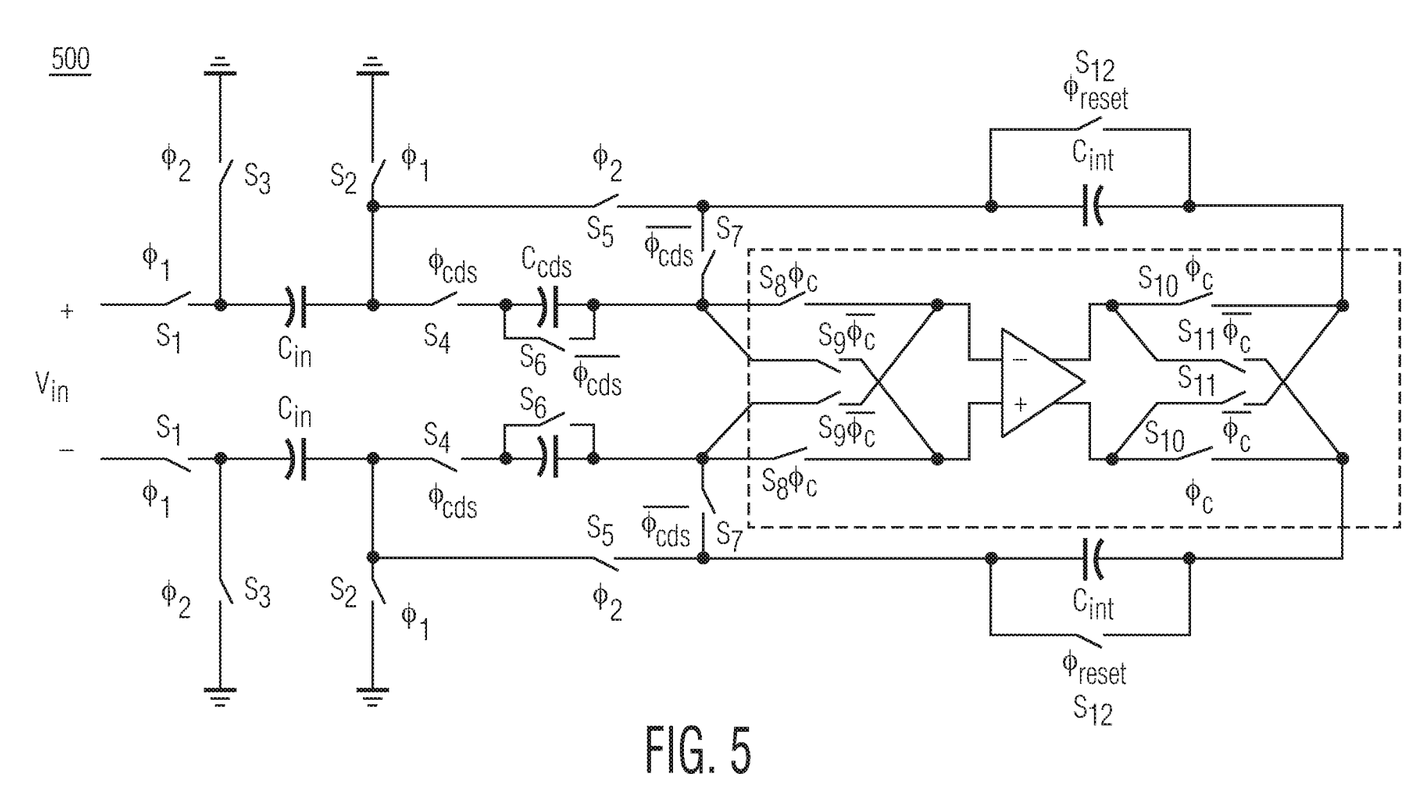
FIG. 5 is a schematic block diagram of differential circuitry that can be used to implement both (i) the first integrator of the second-order Delta-Sigma ADC of FIG. 2 and (ii) the reference buffer for the Nyquist ADC of FIG. 3 or 4.

FIG. 5 is a schematic block diagram of differential circuitry 500 that can be used to implement both (i) the first integrator 210 of the second-order Delta-Sigma ADC 200 of FIG. 2 and (ii) the reference buffer needed to drive the reference (Vref) of the Nyquist ADC 150 of FIG. 3 or the reference ($a_1 b_1$ Vref) of the Nyquist ADC 150 of FIG. 4. Note that the reference buffer of the Nyquist ADC 150 is not explicitly shown in either FIG. 3 or FIG. 4. Note that the same instance of the circuitry 500 can be used to implement both elements, where the circuitry 500 first operates as the first integrator 210 of FIG. 2 when the second-order Delta-Sigma ADC 200 is resolving the MSBs during the first, coarse-conversion step of the two-step, hybrid ADC operation, and then operates as the reference buffer for the Nyquist ADC 150 when the Nyquist ADC 150 is subsequently resolving the LSBs during the second, fine-conversion step of the two-step, hybrid ADC operation.

The differential circuitry 500 has two sets of switches S1-S12 that can be selectively controlled to enable the circuitry 500 to function as either (i) a switched-capacitor integrator that employs chopping for use as the first integrator 210 of FIG. 2 or (ii) a reference buffer that generates a reference voltage for the Nyquist ADC 150 of FIG. 1 that employs CDS for use as the reference buffer. When operated as an integrator with chopping, element FB is a chopped opamp that accumulates voltage in the integrating capacitors Cint.

Figure 6:
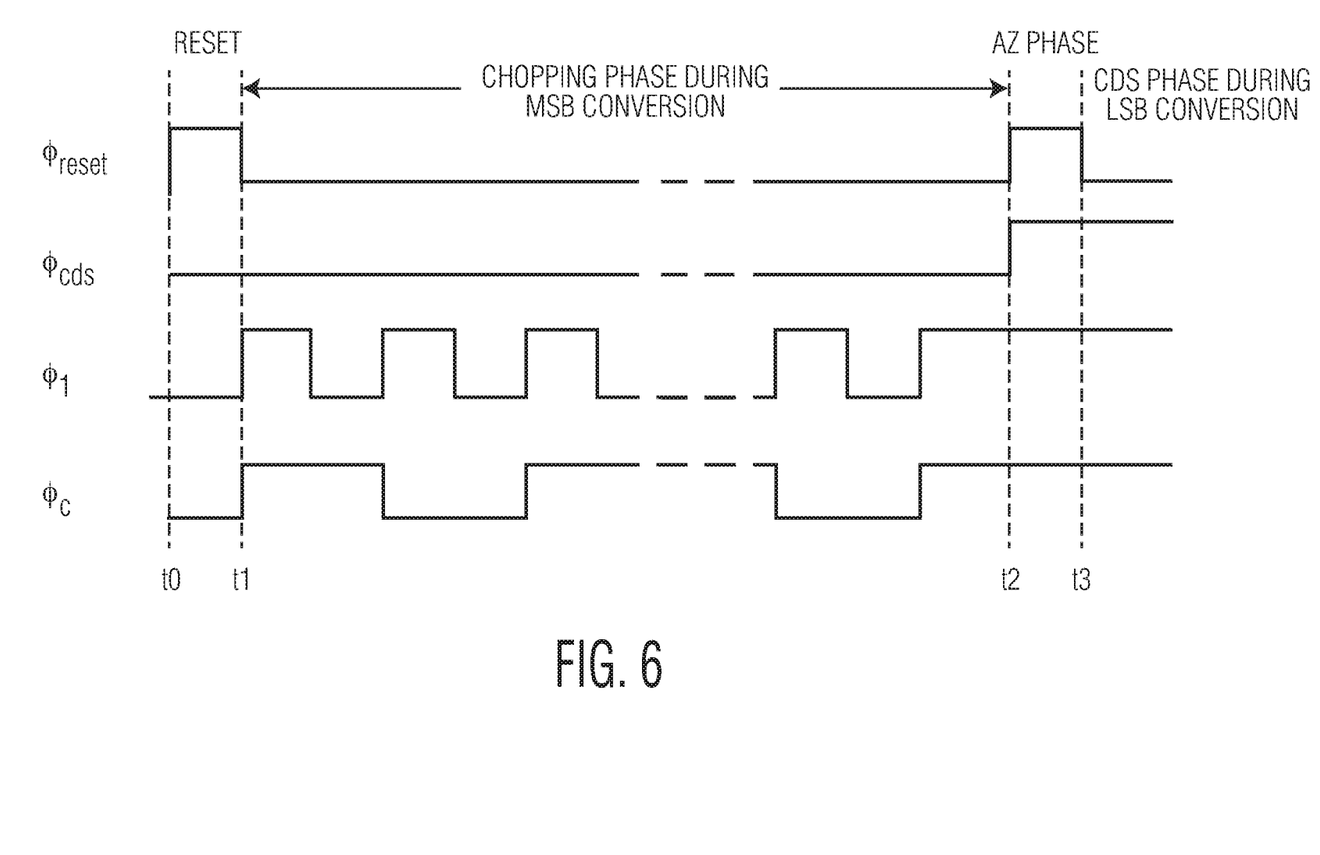
FIG. 6 is a timing diagram of the control signals applied to the various switches in the differential circuitry of FIG. 5 during an example operation of the hybrid ADC of FIG. 1.

FIG. 6 is a timing diagram of the control signals applied to the various switches in the differential circuitry 500 of FIG. 5 during an example operation of the hybrid ADC 100 of FIG. 1. $\emptyset_2$ is the complement (inversion) of $\emptyset_1$. Switches S8 and S10 are controlled by the signal $\emptyset_c$, while switches S9 and S11 are controlled by the complement of $\emptyset_c$.

The time period from time t0 to time t1 corresponds to the resetting of the coarse ADC 110 of FIG. 1. In particular, at time t0, switches S1, S2, S4, S8, and S10 are opened, and switches S3, S5, S6, S7, S9, S11, and S12 are closed, such that the input capacitors Cin, the integrating capacitors Cint, and the CDS capacitors Ccds are all shorted out to reset the circuitry 500 for use as the integrator 210.

The time period from time t1 to time t2 corresponds to the first, coarse-conversion step of the two-step, hybrid ADC operation during which the coarse ADC 110 resolves the MSBs. In particular, at time t1, switches S3, S5, S9, S11, and S12 are opened, and switches S1, S2, S8, and S10 are closed. From time t1 to time t2, chopping is applied to the first integrator 210 by turning on and off the switches S1, S2, S3, S5, S8, S9, S10, and S11 as dictated by the control signals $\emptyset_1$, $\emptyset_2$, and $\emptyset_c$ in FIG. 6, where the chopping frequency can be chosen dependent on the flicker-noise corner frequency.

The auto-zero (AZ) time period from time t2 to time t3 corresponds to the re-configuring of the circuitry 500 from being used as the first integrator 210 of FIG. 2 to being used as the reference buffer for the Nyquist fine ADC 150. In particular, at time t2, switches S3, S5, S6, S7, S9, and S11 are opened, and switches S1, S2, S4, S8, S10, and S12 are closed, thereby disabling the chopping, resetting the integrator, and activating the circuitry 500 to generate the reference voltage using CDS for the second, fine-conversion step of the two-step ADC conversion. By opening and closing those switches at time t2, any offset and flicker noise in the opamp FC at the end of the coarse-conversion step is stored in the CDS capacitors Ccds.

The time period after time t3 corresponds to the second, fine-conversion step of the two-step, hybrid ADC operation during which the fine ADC 150 of FIG. 1 resolves the LSBs. In particular, at time t3, the switches S12 are opened, such that the CDS capacitors Ccds are connected in series with the opamp inputs which cancels the opamp's offset and correlated flicker noise. In the embodiment of FIG. 5, the circuitry 500 acts as the reference buffer for the Nyquist fine ADC 150 having a gain of Cin/Cint, where Cin is the capacitance of the low-pass filter capacitors Cin and Cint is the capacitance of the integrating capacitors Cint.

Figure 7:
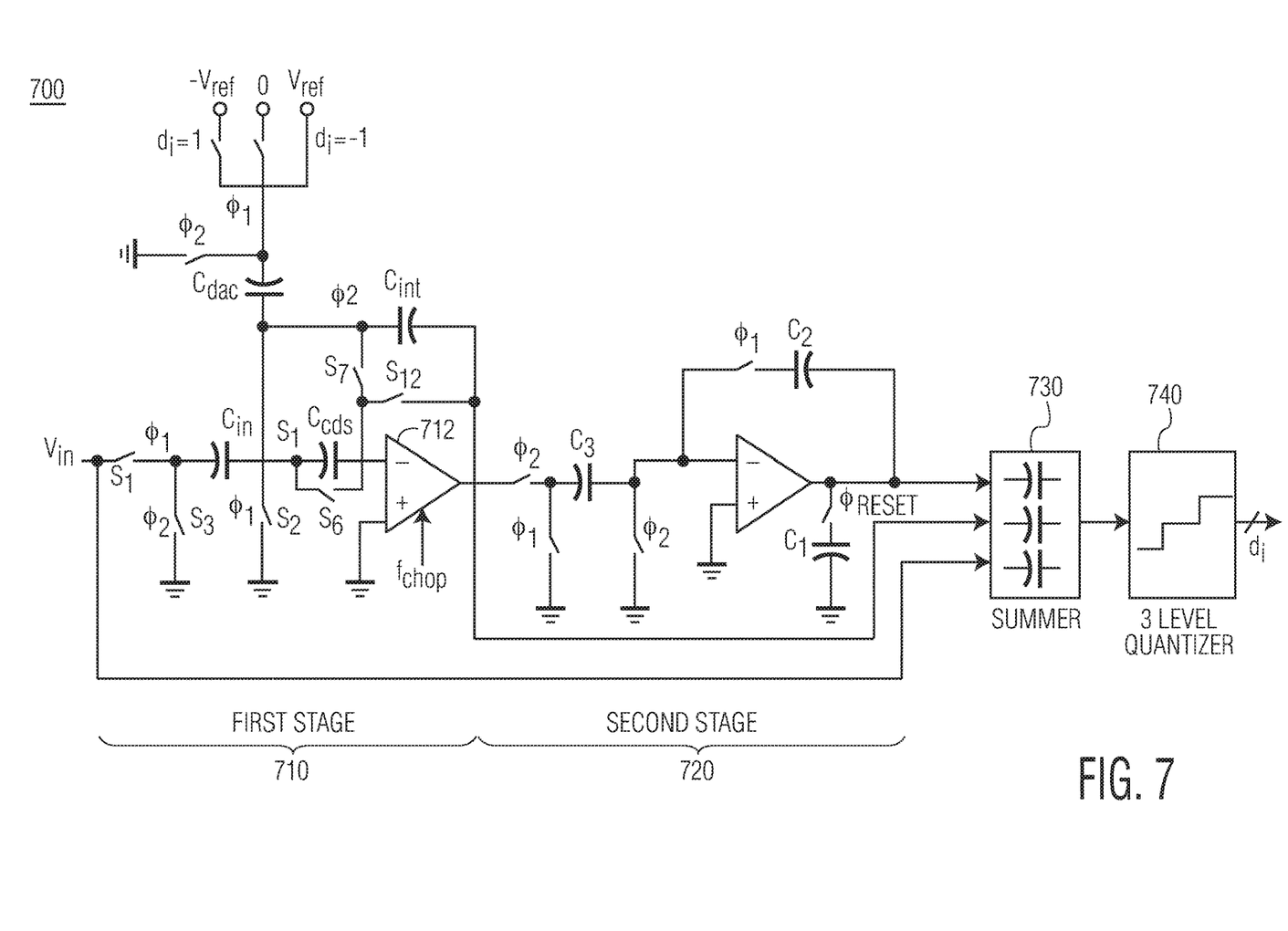
FIG. 7 is a schematic block diagram of a single-ended representation of circuitry that can be used to implement the two-step, hybrid ADC of FIG. 1.

FIG. 7 is a schematic block diagram of a single-ended representation of circuitry 700 that can be used to implement the two-step, hybrid ADC 100 of FIG. 1, where the coarse ADC 110 is a second-order Delta-Sigma ADC that employs chopping and the fine ADC 150 is a Nyquist ADC that employs CDS to generate the reference voltage for the Nyquist ADC. The circuitry 700 includes a first stage 710, a second stage 720, an analog summer 730, and a three-level, two-bit quantizer 740. Note that the switch-control signals $\emptyset_1$ and $\emptyset_2$ in FIG. 7 are the same as those shown in FIG. 6.

For the initial, coarse-conversion step, the circuitry 700 is configured to operate as a second-order Delta-Sigma ADC with (i) the first stage 710 operating as a first integrator that employs chopping and (ii) the second stage 720 operating as a second integrator. Note that, as indicated in FIG. 7, the opamp 712 in the first stage 710 is a chopped opamp analogous to the chopped opamp of FIG. 5. As such, the chopping switches S8-S11 of FIG. 5 are not explicitly shown in FIG. 7.

For the subsequent, fine-conversion step, the second stage 720 is re-configured to operate as a Nyquist ADC with the first stage 710 configured to operate as a reference generator for the Nyquist ADC and the second stage 720 configured to operate as the Nyquist ADC.

The two-step, hybrid ADC 100 of FIG. 1 can provide advantages over conventional two-step, hybrid ADCs that employ either only chopping or only CDS in generating digital output signals. Chopping is a power-efficient technique that can be used to remove offset and flicker noise in a two-step, hybrid ADC. However, in two-step ADC conversion, either the reference signal or the analog residual signal needs to be scaled for the second conversion step. Inaccuracy in this scaling, caused by gain node offset, can result in ADC non-linearity. Chopping is not effective in removing such offset during the second step of ADC conversion, since there is no effective filtering mechanism for offset that is up-converted to the chopping frequency. However, correlated double sampling (CDS) technique can be effectively used to remove such offset. The hybrid ADC 100 of FIG. 1 uses chopping during the first step of ADC conversion. The hybrid ADC 100 is then re-configured to employ CDS in reference scaling for the second step of AC conversion. The use of chopping in the first step of ADC conversion and CDS in the second step enables implementations of two-step, hybrid ADCs that use less power and less area than comparable conventional two-step, hybrid ADCs that employ only chopping or only CDS.

Depending on the particular implementation, the two-step, hybrid ADC 100 of FIG. 1 can be implemented (i) using two distinct sets of circuitry for the coarse ADC 110 and the fine ADC 150 or (ii) using a single set of circuitry that is configured to operate as the coarse ADC 110 during the first, coarse-conversion step and then re-configured to operate as the fine ADC 150 during the second, fine-conversion step.

Embodiments of the invention may be implemented as circuit-based processes, including possible implementation in a single integrated circuit (such as an ASIC or an FPGA).

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A two-step, hybrid analog-to-digital converter (ADC) for converting an analog input signal into a digital output signal, the hybrid ADC comprising:
   a Delta-Sigma ADC that employs chopping to resolve one or more most-significant bits (MSBs) for the analog input signal;
   a Nyquist ADC that employs correlated double sampling (CDS) to resolve one or more least-significant bits (LSBs) for the analog input signal; and
   a combiner that combines the one or more MSBs and the one or more LSBs to generate the digital output signal.

2. The two-step hybrid ADC of claim 1, wherein the Delta-Sigma ADC is a second-order Delta-Sigma ADC comprising a first integrator and a second integrator.

3. The two-step hybrid ADC of claim 2, wherein the chopping is employed in the first integrator.

4. The two-step hybrid ADC of claim 2, wherein the first integrator comprises CDS switches that are used to re-configure the first integrator to generate a reference voltage for the Nyquist ADC.

5. The two-step hybrid ADC of claim 2, wherein the first integrator is re-configurable to function as a reference buffer for the Nyquist ADC.

6. The two-step hybrid ADC of claim 5, wherein the second integrator is re-configurable to function as the Nyquist ADC.

7. The two-step hybrid ADC of claim 1, wherein the ADC is implemented in a single integrated circuit.

8. A method for converting an analog input signal into a digital output signal, the method comprising:
   performing Delta-Sigma ADC processing with chopping to resolve one or more MSBs for the analog input signal;
   then performing Nyquist ADC processing using CDS to generate a reference voltage for the Nyquist ADC processing to resolve one or more LSBs for the analog input signal; and
   combining the one or more MSBs and the one or more LSBs to generate the digital output signal.

9. The method of claim 8, wherein the Delta-Sigma ADC processing is second-order Delta-Sigma ADC processing employing a first integrator and a second integrator.

10. The method of claim 9, wherein the chopping is employed in the first integrator.

11. The method of claim 9, wherein the first integrator comprises CDS switches that re-configure the first integrator to generate a reference voltage for the Nyquist ADC.

12. The method of claim 9, wherein the first integrator is re-configured to function as a reference buffer for the Nyquist ADC.

13. The method of claim 12, wherein the second integrator is re-configured to function as the Nyquist ADC.

\* \* \* \* \*